United States Patent
Pollard et al.

(10) Patent No.: US 8,440,389 B2
(45) Date of Patent: May 14, 2013

(54) STRIPPER SOLUTIONS EFFECTIVE FOR BACK-END-OF-LINE OPERATIONS

(75) Inventors: Kimberly Dona Pollard, Anderson, IN (US); John M. Atkinson, Zionsville, IN (US); Raymond Chan, Westborough, MA (US); Michael T. Phenis, Markleville, IN (US); Allison C. Rector, Indianapolis, IN (US); Donald Pfettscher, Brownsburg, IN (US)

(73) Assignee: Dynaloy, LLC, Kingsport, TN (US)

( * ) Notice: Subject to any disclaimer, the term of this patent is extended or adjusted under 35 U.S.C. 154(b) by 317 days.

(21) Appl. No.: 12/490,654

(22) Filed: Jun. 24, 2009

(65) Prior Publication Data
US 2010/0221503 A1    Sep. 2, 2010

Related U.S. Application Data

(60) Provisional application No. 61/075,195, filed on Jun. 24, 2008.

(51) Int. Cl.
*G03F 7/30* (2006.01)
*G03F 7/32* (2006.01)
*C11D 7/32* (2006.01)

(52) U.S. Cl.
USPC ............ 430/329; 430/331; 510/175; 510/176

(58) Field of Classification Search .................. 510/175, 510/176; 430/270.1, 331, 329
See application file for complete search history.

(56) References Cited

U.S. PATENT DOCUMENTS

| | | |
|---|---|---|
| 3,562,038 A | 2/1971 | Shipley et al. |
| 3,673,099 A | 6/1972 | Corby et al. |
| 3,873,688 A | 3/1975 | Kalopissis et al. |
| 3,888,891 A | 6/1975 | Smith et al. |
| 3,920,695 A | 11/1975 | Smith et al. |
| 3,963,744 A | 6/1976 | Smith et al. |
| 3,981,859 A | 9/1976 | Smith et al. |
| 4,038,293 A | 7/1977 | Smith et al. |
| 4,518,675 A | 5/1985 | Kataoka |
| 4,547,271 A | 10/1985 | Bharucha et al. |

(Continued)

FOREIGN PATENT DOCUMENTS

| | | |
|---|---|---|
| EP | 0 678 571 A | 10/1995 |
| EP | 1 562 225 A | 8/2005 |

(Continued)

OTHER PUBLICATIONS

Ho et al., Controlled Nanoscale Doping of Semiconductors via Molecular Monolayers, Nature Materials, vol. 7, Jan. 2008, pp. 62-67, entire document.

(Continued)

*Primary Examiner* — Amanda C. Walke
(74) *Attorney, Agent, or Firm* — Dennis V. Carmen (57) ABSTRACT

Back end of line (BEOL) stripping solutions which can be used in a stripping process that replaces etching resist ashing process are provided. The stripping solutions are useful for fabricating circuits and/or forming electrodes on semiconductor devices for semiconductor integrated circuits with good efficiency and with low and acceptable metal etch rates. Methods for their use are similarly provided. The preferred stripping agents contain a polar aprotic solvent, water, an amine and a quaternary hydroxide that is not tetramethylammonium hydroxide. Further provided are integrated circuit devices and electronic interconnect structures prepared according to these methods.

19 Claims, 7 Drawing Sheets

U.S. PATENT DOCUMENTS

| | | | |
|---|---|---|---|
| 4,787,997 A | 11/1988 | Saito et al. | |
| 4,830,641 A | 5/1989 | White, Jr. et al. | |
| 5,008,273 A | 4/1991 | Schnorrenberg et al. | |
| 5,233,010 A | 8/1993 | McGhee et al. | |
| 5,252,737 A | 10/1993 | Stern et al. | |
| 5,304,284 A | 4/1994 | Jagannathan et al. | |
| 5,308,745 A | 5/1994 | Schwartzkopf | |
| 5,369,189 A | 11/1994 | Kim et al. | |
| 5,417,877 A | 5/1995 | Ward | |
| 5,419,779 A | 5/1995 | Ward | |
| 5,422,309 A | 6/1995 | Zettler et al. | |
| 5,453,541 A | 9/1995 | Stern et al. | |
| 5,468,423 A | 11/1995 | Garabedian, Jr. et al. | |
| 5,597,678 A | 1/1997 | Honda et al. | |
| 5,608,111 A | 3/1997 | Stern et al. | |
| 5,612,304 A | 3/1997 | Honda et al. | |
| 5,623,088 A | 4/1997 | Stern et al. | |
| 5,648,324 A | 7/1997 | Honda et al. | |
| 5,795,702 A | 8/1998 | Tanabe et al. | |
| 5,798,323 A | 8/1998 | Honda et al. | |
| 5,840,622 A | 11/1998 | Miles et al. | |
| 5,928,430 A | 7/1999 | Ward et al. | |
| 6,033,996 A * | 3/2000 | Rath et al. | 438/756 |
| 6,063,522 A | 5/2000 | Hamrock et al. | |
| 6,137,010 A | 10/2000 | Joo et al. | |
| 6,200,891 B1 * | 3/2001 | Jagannathan et al. | 438/622 |
| 6,276,372 B1 | 8/2001 | Lee | |
| 6,319,835 B1 | 11/2001 | Sahbari et al. | |
| 6,372,410 B1 | 4/2002 | Ikemoto et al. | |
| 6,399,273 B1 | 6/2002 | Yamada et al. | |
| 6,455,479 B1 | 9/2002 | Sahbari | |
| 6,465,403 B1 * | 10/2002 | Skee | 510/175 |
| 6,482,656 B1 | 11/2002 | Lopatin | |
| 6,531,436 B1 | 3/2003 | Sahbari et al. | |
| 6,566,322 B1 | 5/2003 | Brook et al. | |
| 6,579,668 B1 | 6/2003 | Baik et al. | |
| 6,638,694 B2 | 10/2003 | Ikemoto et al. | |
| 6,683,219 B2 | 1/2004 | DeLuca et al. | |
| 6,777,380 B2 * | 8/2004 | Small et al. | 510/176 |
| 6,825,156 B2 | 11/2004 | Lee et al. | |
| 6,844,461 B2 | 1/2005 | DeLuca et al. | |
| 6,846,748 B2 | 1/2005 | Chien et al. | |
| 6,872,663 B1 | 3/2005 | Okada | |
| 6,878,500 B2 | 4/2005 | Rutter, Jr. et al. | |
| 6,916,772 B2 * | 7/2005 | Zhou et al. | 510/201 |
| 7,049,275 B2 | 5/2006 | Ikemoto et al. | |
| 7,064,087 B1 | 6/2006 | Turner et al. | |
| 7,144,848 B2 | 12/2006 | Zhou et al. | |
| 7,157,605 B2 | 1/2007 | Kim et al. | |
| 7,166,362 B2 | 1/2007 | Kano | |
| 7,528,098 B2 | 5/2009 | Lee et al. | |
| 7,543,592 B2 | 6/2009 | Lee | |
| 7,579,308 B2 | 8/2009 | Lee | |
| 7,615,377 B2 | 11/2009 | Lippard et al. | |
| 7,632,796 B2 * | 12/2009 | Phenis et al. | 510/175 |
| 7,655,608 B2 | 2/2010 | Pollard et al. | |
| 7,851,427 B2 | 12/2010 | Pollard et al. | |
| 2001/0014534 A1 | 8/2001 | Aoki et al. | |
| 2002/0037819 A1 | 3/2002 | Sahbari | |
| 2002/0128164 A1 | 9/2002 | Hara et al. | |
| 2002/0152925 A1 | 10/2002 | Soutar et al. | |
| 2003/0130149 A1 * | 7/2003 | Zhou et al. | 510/176 |
| 2003/0138737 A1 | 7/2003 | Wakiya et al. | |
| 2003/0181344 A1 * | 9/2003 | Ikemoto et al. | 510/175 |
| 2003/0186175 A1 | 10/2003 | Ikemoto et al. | |
| 2003/0194636 A1 | 10/2003 | Wanat et al. | |
| 2003/0228990 A1 | 12/2003 | Lee et al. | |
| 2004/0038840 A1 | 2/2004 | Lee et al. | |
| 2004/0048761 A1 | 3/2004 | Ikemoto et al. | |
| 2004/0081922 A1 | 4/2004 | Ikemoto et al. | |
| 2004/0106532 A1 | 6/2004 | Yokoi et al. | |
| 2004/0134873 A1 | 7/2004 | Yao et al. | |
| 2004/0147420 A1 | 7/2004 | Zhou et al. | |
| 2004/0256358 A1 * | 12/2004 | Shimizu et al. | 216/83 |
| 2004/0266912 A1 | 12/2004 | Aida et al. | |
| 2005/0016961 A1 | 1/2005 | Toda et al. | |
| 2005/0074556 A1 | 4/2005 | Kano | |
| 2005/0090416 A1 | 4/2005 | Lee et al. | |
| 2005/0112769 A1 | 5/2005 | Lippard et al. | |
| 2005/0143365 A1 | 6/2005 | Kim et al. | |
| 2005/0176259 A1 | 8/2005 | Yokoi et al. | |
| 2005/0202987 A1 | 9/2005 | Small et al. | |
| 2005/0263743 A1 | 12/2005 | Lee | |
| 2006/0003910 A1 | 1/2006 | Hsu et al. | |
| 2006/0014656 A1 | 1/2006 | Egbe et al. | |
| 2006/0046446 A1 | 3/2006 | Kon et al. | |
| 2006/0073997 A1 | 4/2006 | Leonte et al. | |
| 2006/0094613 A1 | 5/2006 | Lee | |
| 2006/0099831 A1 | 5/2006 | Borovik et al. | |
| 2006/0138399 A1 | 6/2006 | Itano et al. | |
| 2006/0258887 A1 | 11/2006 | Kim et al. | |
| 2007/0111912 A1 | 5/2007 | Phenis et al. | |
| 2007/0149430 A1 | 6/2007 | Egbe et al. | |
| 2007/0243773 A1 | 10/2007 | Phenis et al. | |
| 2008/0011714 A1 | 1/2008 | Yokoi et al. | |
| 2008/0070404 A1 | 3/2008 | Beck et al. | |
| 2008/0076688 A1 | 3/2008 | Barnes et al. | |
| 2008/0261847 A1 | 10/2008 | Visintin et al. | |
| 2009/0047609 A1 | 2/2009 | Atkinson et al. | |
| 2009/0119979 A1 | 5/2009 | Mullen | |
| 2009/0186793 A1 | 7/2009 | Phenis et al. | |
| 2010/0056409 A1 | 3/2010 | Walker et al. | |
| 2010/0104824 A1 | 4/2010 | Phenis et al. | |
| 2010/0112728 A1 | 5/2010 | Korzenski et al. | |
| 2010/0249181 A1 | 9/2010 | DeGoey et al. | |
| 2010/0298605 A1 | 11/2010 | Hirose et al. | |

FOREIGN PATENT DOCUMENTS

| | | |
|---|---|---|
| EP | 1 736 534 A1 | 12/2006 |
| JP | 62-188785 A | 8/1987 |
| JP | 07-28254 A | 1/1995 |
| JP | 2001 312074 A | 11/2001 |
| JP | 2003-255565 A | 9/2003 |
| JP | 2004 093678 A | 3/2004 |
| JP | 2004-133153 A | 4/2004 |
| RU | 1 807 077 A1 | 4/1993 |
| WO | WO 03 083920 A | 10/2003 |

OTHER PUBLICATIONS

"Resorcinol CAS# 108-46-3", IS Chemical Technology, 2010.
Notification of Transmittal of the International Search Report dated Jun. 5, 2008 for corresponding PCT/US2006/041394.
Notification of Transmittal of the International Search Report dated Feb. 21, 2008 for corresponding PCT/US2007/066128.
Notification of Transmittal of the International Search Report dated Jan. 12, 2009 for corresponding PCT/US2008/071485.
Written opinion of the International Searching Authority dated Jan. 12, 2009 for corresponding PCT/US2008/071485.
Written opinion of the International Searching Authority dated Feb. 21, 2008 for corresponding PCT/US2007/066128.
Written opinion of the International Searching Authority dated Nov. 25, 2009 for corresponding PCT/US2009/048409.
Notification of Transmittal of the International Search Report dated Nov. 25, 2009 for corresponding PCT/US2009/048409.
Notification of Transmittal of the International Search Report dated May 13, 2011 for corresponding PCT/US2011/027493.
Written opinion of the International Searching Authority dated May 13, 2011 for corresponding PCT/US2011/027493.
USPTO Office Action dated Oct. 15, 2012 for co-pending U.S. Appl. No. 12/091,808.
Co-pending U.S. Appl. No. 13/645,539, filed Nov. 16, 2012.
Co-pending U.S. Appl. No. 13/651,790, filed Oct. 15, 2012.

* cited by examiner

*Fig. 6*

STRIPPER SOLUTIONS EFFECTIVE FOR BACK-END-OF-LINE OPERATIONS

This application claims the benefit of U.S. Provisional Application No. 61/075,195, filed Jun. 24, 2008, which is hereby incorporated by reference.

FIELD OF THE INVENTION

The present disclosure relates to a back-end-of-line (BEOL) stripping agent for use in fabricating circuits or forming electrodes on semiconductor devices for semiconductor integrated circuits or liquid crystal displays, semiconductor devices made with the new BEOL stripping agent, and further to a process of producing semiconductor devices using the BEOL stripping agent and for producing the BEOL stripping agent.

BACKGROUND

The technology of fabricating semiconductor integrated circuits has advanced with regard to the number of transistors, capacitors and other electronic devices which can be fabricated on a single integrated circuit chip. This increasing level of integration has resulted in large part from a reduction in the minimum feature sizes of the integrated circuits and an increase in the number of layers which make up the integrated circuit. Today's design features, generally referred to as "submicron" have dropped below 0.25 microns. The manufacture of integrated circuit components having this reduced size and the need to reduce production steps has placed new demands on all aspects of their production including the removal of resists and related materials with chemical stripper solutions.

Semiconductor devices for semiconductor integrated circuits or liquid crystal displays are commonly produced by a process including the steps of coating a substrate with one or more layers of polymeric resist materials to provide a resist film; patterning the photosensitive resist film by exposure to light and subsequent development; etching exposed portions of the substrate using the patterned resist film as a mask to form minute circuits; and removing the resist film from the inorganic substrate. Alternatively, after forming minute circuits, the post etch residues can be ashed and the remaining resist residues removed from the substrate with a post etch residue remover. This portion of circuit fabrication is referred to as the back-end-of-line (BEOL) fabrication. What is needed is a BEOL stripper solution which can remove remaining photoresists and post etch residues in a single step.

A superior BEOL stripper solution should: (a) quickly and cleanly remove resist residues, etch residues and related materials at moderate to low temperatures without requiring a final ashing or post etch removal step, (b) have an acceptable effect on the all exposed components, particularly the underlying low or ultra low-κ dielectric and metals, (c) have a substantial capacity to dissolve and/or suspend resist and/or post etch residue to forestall precipitation and/or re-deposition of solid onto the wafer necessitating the early disposal of the stripper solution, (d) be safe to use in a manufacturing environment, (e) have an acceptable shelf-life and (f) be backward compatible with lower technology nodes. A superior BEOL stripper solution should also quickly remove resist residues in a rework process without substrate damage. Finally, superior stripper solutions should exhibit minimal toxicity. This present disclosure addresses and resolves these needs.

SUMMARY

A general object of the present invention is to provide a composition for removing a photoresist, residue, and related materials from a back-end-of-line (BEOL) operation, a method for utilizing the composition in the manufacture of a semiconductor structure, and a semiconductor structure manufactured utilizing the composition. Preferred embodiments of the composition can be utilized without etching or otherwise damaging metals and/or dielectric material contained in or on the semiconductor structure. As used herein, the term resist refers to a photoresist or resist material, a post etch residue, or a combination thereof.

One object of the present disclosure is a BEOL stripper composition which includes a polar aprotic solvent, water, an amine and a quaternary hydroxide. Suitable quaternary hydroxides are represented by formula I, provided below:

where Z is N or P and $R^1$, $R^2$, $R^3$, and $R^4$ are alkyl groups, aryl groups, or a combination thereof having collectively at least 5 carbons. The preferred BEOL stripper solutions contain substantially no tetramethylammonium hydroxide. For preferred BEOL stripper solutions, the amine is a hydroxy-substituted alkylamine and/or an alkyl ether of a hydroxy-substituted alkylamine. A particularly preferred hydroxy-substituted alkylamine is monoethanolamine and a preferred amine ether is the methyl ether of a hydroxy-substituted alkylamine. For the preferred BEOL stripper solutions, the polar aprotic solvent is dimethyl sulfoxide (DMSO). Although the concentrations of DMSO can range from about 20% to about 95%, in the preferred BEOL solutions, the aprotic solvent concentration generally ranges from about 40 to about 90 weight percent, more preferably from about 55 to about 90 weight percent. Water content for the preferred solutions generally ranges from about 2 to about 15 weight percent. However, the optimum amount of water can vary depending on the selection of the other components and their proportions. Although the BEOL stripper solutions described herein have been optimized for BEOL applications, these stripper solutions can be used to remove photoresists, etch residues, and the like in a variety of other standard applications including, but not limited to (i) high dose implant resist removal, (ii) post etch residue in gate formation, (iii) post etch residue in floating gate formation, and (iv) re-work applications.

Another object of the present disclosure is to provide a method for removing a resist film from a substrate in a BEOL process. The method includes the steps of providing a substrate having a component selected from the group consisting of photoresists, planarizing materials, photoresist residues, and the like thereon, and contacting the substrate with a composition including the BEOL stripper solution to effect removal of the photoresist and related materials. Photoresists, planarizing materials, photoresist residues, and the like are collectively referred to herein as "resists." Preferred BEOL stripper solutions used in the contacting step include those described above. The step of contacting can involve immersion of a substrate in a stripper solution or by spraying the stripper solution onto the substrate using a spray tool, with or without other cleaning aids such as for example megasonics. Further steps following contacting can involve the additional steps of removing the substrate from contact with the stripper solution and/or rinsing the substrate with an appropriate solvent. During the contacting step, the stripper solution is pref- erably maintained at a temperature of at least about 40° C. and more preferably at a temperature ranging from about 50° C. to about 75° C.

Figure 4:
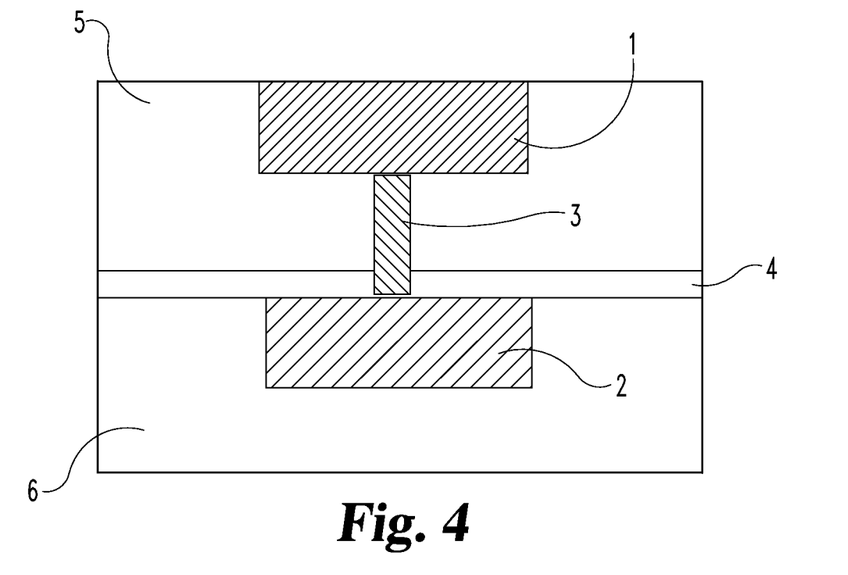
FIG. 4 illustrates an electronic interconnect structure.

An important substrate property is a low-κ permittivity value. This value can change, typically increase, following contact with a stripper solution. This change in the low-κ permittivity value (Δκ) can be minimized by removing volatiles from the substrate following contact with the stripper solution and a rinsing step. Volatiles can be removed from a treated substrate by heating the substrate, subjecting the substrate to a reduced pressure, or a combination thereof. Removal can occur as a result of a treatment specifically designed to remove volatiles or occur coincidentally during subsequent processing steps that involve heating and/or vacuum treatment. With current technology, it is desirable that the removal of a resist from a substrate result in a change in the low-κ permittivity value of $\leq 0.1$ Another object of the present disclosure is to provide an electronic interconnect structure prepared in part by removing resists, resist residues, and the like from a substrate having metal components according to the method described above to produce an interconnect structure with a reduced number of etching processes and providing reduced damage to the structure. FIG. 4 illustrates a typical electronic interconnect structure having trenches 1 and 2 interconnected through via 3 within two dielectric layers 5 and 6 separated by a barrier layer 4. Trenches 1 and 2 and via 3 are typically filled with a metal such as copper, aluminum, or alloys containing these metals. Corrosion and/or etching of these metals are typically reduced when the preferred BEOL stripper solutions are utilized in the preparation of the electronic interconnects.

Figure 5:
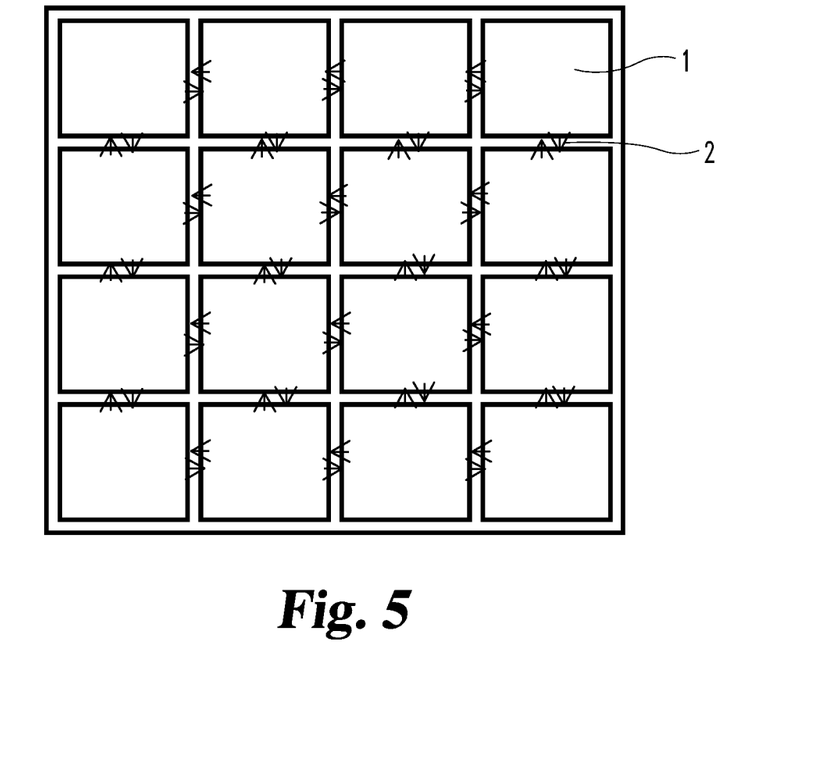
FIG. 5 illustrates an electronic device containing a plurality of electronic interconnect structures.

Another object of the present disclosure is to provide an integrated circuit device obtainable in part by processing wafers containing metal components to remove resist residues according to the method described above with reduced metal etching. FIG. 5 illustrates a typical integrated circuit device having a plurality of computer chips illustrated by 1 interconnected through chip routers illustrated by 2.

A still further object of the present disclosure is to provide a method for preparing a BEOL stripper solution by providing a container; providing the components of a stripper solution; and adding the components to the container to provide contents within the container. Providing components can include providing individual components, a composition containing various components, or combinations thereof. Further, adding components of a stripper solution can involve adding individual components, premixed components, and/or a preformed stripper solution containing provided components in substantially any order. Preferred components include a polar aprotic organic solvent, water, an amine, and a quaternary hydroxide, where the quaternary hydroxide has the formula:

where Z is N or P and $R^1$, $R^2$, $R^3$, and $R^4$ are alkyl groups, aryl groups, or a combination thereof having collectively at least 5 carbons. A container can include substantially any vessel capable of holding a stripper solution and includes a typical container used for shipping or transporting a liquid product, equipment used to contain stripper solutions for use processing substrates to remove photoresists and/or etch residues. As used herein a vessel includes equipment used to hold and/or transport a stripper solution during the processing of substrates and includes, but is not limited to, holding and transfer vessels including any pipe system used to transport a stripper solution.

DESCRIPTION

For the purposes of promoting an understanding of the present disclosure, references will now be made to the embodiments illustrated and specific language will be used to describe the same. It will nevertheless be understood that no limitation of the scope of what is claimed is thereby intended, such alterations and further modifications and such further applications of the principles thereof as illustrated therein being contemplated as would normally occur to one skilled in the art to which the disclosure relates.

As used herein, back-end-of line or BEOL, refers to the part of integrated circuit fabrication where transistors, resistors, and the like are interconnected with the wiring. The BEOL portion of fabrication typically begins with patterning for the first metal contact or with deposition of the first layer of metal onto the wafer.

The compositions according to this present disclosure include a BEOL stripper solution containing a polar aprotic solvent, water, and an amine and a quaternary hydroxide. Preferred stripper solutions comprise dimethyl sulfoxide, water, an amine and a quaternary hydroxide represented by the following formula:

where Z is N or P and $R^1$, $R^2$, $R^3$, and $R^4$ are alkyl groups, aryl groups, or a combination thereof having collectively at least 5 carbons. The BEOL stripper solutions can also contain an alkanolamine or the alkyl ether of an alkanolamine. Preferred quaternary hydroxides include tetrabutylammonium hydroxide and tetrabutylphosphonium hydroxide. Particularly preferred BEOL stripper solutions are also substantially free of tetramethylammonium hydroxide ("TMAH"). A stripper solution that contains less than about 0.5% TMAH is considered to be substantially free of TMAH.

The compositions typically contain about 20% to about 95%, and more preferably from about 40% to about 90% of a polar aprotic solvent such as, for example, DMSO and from about 2% to about 10% of the quaternary hydroxide. Preferred quaternary substituents include ($C_1$-$C_8$) alkyl, benzyl, aryl and combinations thereof provided that the number of carbons included in the four substituents is at least 5. The stripping formulations can also contain an optional surfactant, typically at levels in the range of about 0.01% to about 3% or more preferably in the range of from about 0.01 to about 2%. Suitable levels of the required alkanolamine can range from about 2% to about 60% of the composition. The preferred compositions tested so far also include from about 2% to about 10% water. All %'s provided herein are weight per cents.

Preferred alkanolamines have at least two carbon atoms and have the amino and hydroxyl substituents on different carbon atoms. Suitable alkanolamines include, but are not limited to, ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, and 2-(2-aminoethoxy)ethanol. Ethers of the preferred alkanolamines can similarly be utilized.

Although not required, formulations of the stripper solutions can additionally contain a corrosion inhibitor to further minimize any metal corrosion during contact with the stripper solution. Suitable corrosion inhibitors include, but are not limited to, Cu(I) and Cu(II) salts, aromatic hydroxyl compounds such as catechol; alkylcatechols such as methylcatechol, ethylcatechol and t-butylcatechol, resorcinols, phenols and pyrogallol; aromatic triazoles such as benzotriazole; alkylbenzotriazoles; carboxylic acids such as formic acid, acetic acid, propionic acid, butyric acid, isobutyric acid, oxalic acid, malonic acid, succinic acid, glutaric acid, maleic acid, fumaric acid, benzoic acid, phtahlic acid, 1,2,3-benzenetricarboxylic acid, glycolic acid, lactic acid, malic acid, citric acid, acetic anhydride, phthalic anhydride, maleic anhydride, succinic anhydride, salicylic acid, gallic acid, and gallic acid esters such as methyl gallate and propyl gallate; organic salts of carboxyl containing organic containing compounds described above, ethyl silicate, basic substances such as ethanolamine, trimethylamine, diethylamine and pyridines, such as 2-aminopyridine, and the like, and chelate compounds such as phosphoric acid-based chelate compounds including 1,2-propanediaminetetramethylene phosphonic acid and hydroxyethane phosphonic acid, carboxylic acid-based chelate compounds such as ethylenediaminetetraacetic acid and its sodium and ammonium salts, dihydroxyethylglycine and nitrilotriacetic acid, amine-based chelate compounds such as bipyridine, tetraphenylporphyrin and phenanthroline, and oxime-based chelate compounds such as dimethylglyoxime and diphenylglyoxime. A single corrosion inhibitor may be used or a combination of corrosion inhibitors may be used. Examples of suitable corrosion inhibitors useful in the BEOL stripper solutions are described in U.S. patent application Ser. No. 11/928,754, filed on Oct. 30, 2007, and in U.S. patent application Ser. No. 11/928,728, filed on Oct. 30, 2007. Corrosion inhibitors have typically proven useful at levels ranging from about 1 ppm to about 10%.

Preferred stripper solutions can also be formulated to minimize or prevent damage to the low or ultra low-κ dielectric layers present in a wafer. One approach involves the addition of a dielectric damage inhibitor such as glycerine. Suitable levels of glycerin or other inhibitor are currently believed to be in the order of about 0.25 to 1%. A second approach involves replacement of a low molecular weight alkanolamine with a higher molecular weight alkanolamine. Reduced damage to the dielectric layer has been achieved by replacing, on a gram for gram basis, monoethanolamine with aminoethylethanolamine.

Preferred optional surfactants have included fluorosurfactants. One example of a preferred fluorosurfactant is DuPont FSO (fluorinated telomere B monoether with polyethylene glycol (50%), ethylene glycol (25%), 1,4-dioxane (<0.1%), water 25%).

Preferred temperatures of at least 40° C. are preferred for contacting the substrate whereas for a majority of applications, temperatures of from about 50° C. to about 75° C. are more preferred. For particular applications where the substrate is either sensitive or longer removal times are required, lower contacting temperatures are appropriate. For example, when reworking substrates, it may be appropriate to maintain the stripper solution at a lower temperature for a longer time to remove the photoresist and avoid damaging to the substrate. If longer contact times are required for complete resist removal, placing a blanket of dry nitrogen over the stripper solution can reduce water uptake from the atmosphere and maintain the dry stripper solution's improved performance.

When immersing a substrate, agitation of the composition additionally facilitates photoresist removal. Agitation can be effected by mechanical stirring, circulating, by bubbling an inert gas through the composition, or any combination thereof. Upon removal of the desired amount of resist film, the substrate is removed from contact with the stripper solution and rinsed with water, an alcohol, or a mixture thereof. DI water is a preferred form of water and isopropanol is a preferred alcohol. For substrates having components subject to oxidation, rinsing can be done under an inert atmosphere. The preferred stripper solutions according to the present disclosure have improved loading capacities for photoresist materials compared to current commercial products and are able to process a larger number of substrates with a given volume of stripper solution. As used herein, loading capacity refers to the ability of a stripper solution to dissolve, suspend, or otherwise avoid precipitation and/or re-deposition of a solid onto a wafer being cleaned.

In addition to immersion techniques, wafers can also be contacted with a stripper solution utilizing a spray device with the stripper solution maintained at the desired temperature.

The spraying can optionally be carried out using additional cleaning aids including ultrasonics and/or under an inert atmosphere or optionally in the presence of an active gas such as, for example, oxygen or ozone. The wafer can be removed periodically and inspected to determine when sufficient cleaning has occurred. The clean wafer can be rinsed with isopropanol and dried. This method can be used to remove multiple layers of resist and as a BEOL cleaning step.

Figure 6:
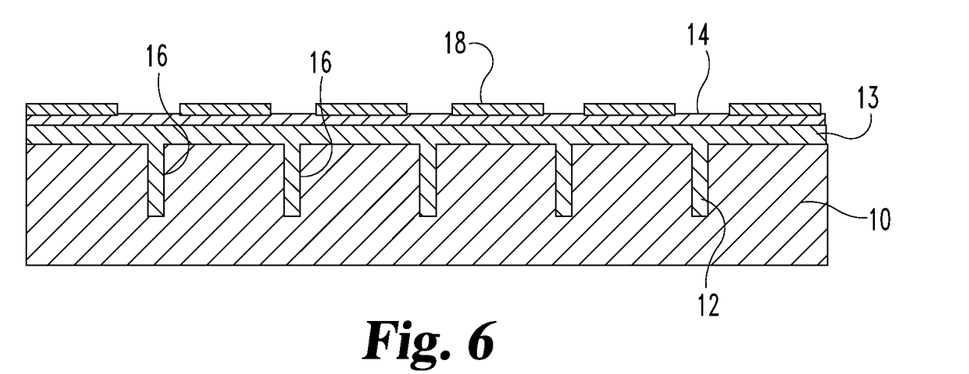
FIG. 6 illustrates a typical photoresist or resist stack.

Additionally, wafers containing resist stacks having one or multiple layers of positive and/or negative resists can also be processed by these methods. Typical resist stacks can include, but are not limited to, one or multiple layers of resist which can include, for example, a planarizing layer, a bottom anti-reflection coating layer, a hard mask, and/or a photoresist. FIG. 6 illustrates a typical generic via first resist stack that includes: (a) an ultra low-κ dielectric 10, (b) a planarizing material 12 within and above the vias 16 and the dielectric 10, (c) a hard mask 13 in contact with the planarizing material 12, (d) a bottom antireflection coating 14 in contact with the hard mask 13, and (e) a photoresist 18. FIG. 6 is provided to illustrate the relationship between layers in one type of typical stack layer and is not meant to limit the utility of the stripper solutions disclosed. One skilled in the art will recognize that other combinations of layers can be utilized depending on the process being utilized and the materials selected and that the solutions disclosed can similarly remove these other stack layer combinations.

Figure 1A:
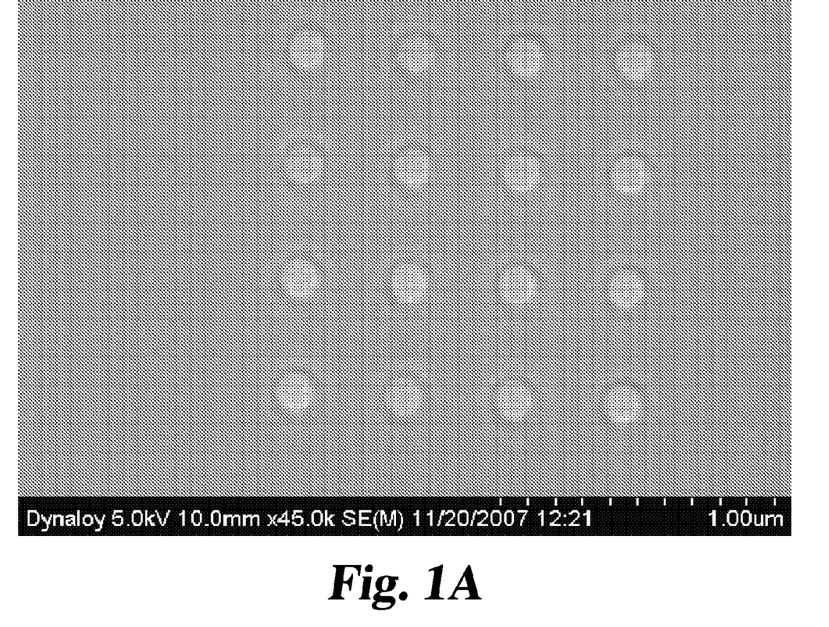
FIG. 1A provides an SEM (top view) of a via array after an unsuccessful cleaning procedure that would be considered not clean (NC).
Figure 1B:
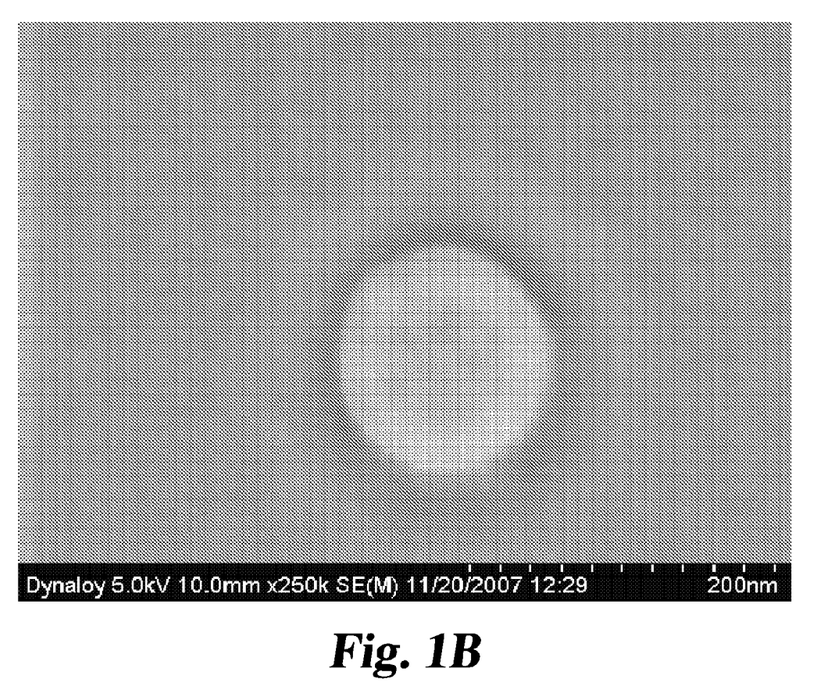
FIG. 1B provides an SEM (top view) of a single via after an unsuccessful cleaning procedure that would be considered not clean (NC).
Figure 2A:
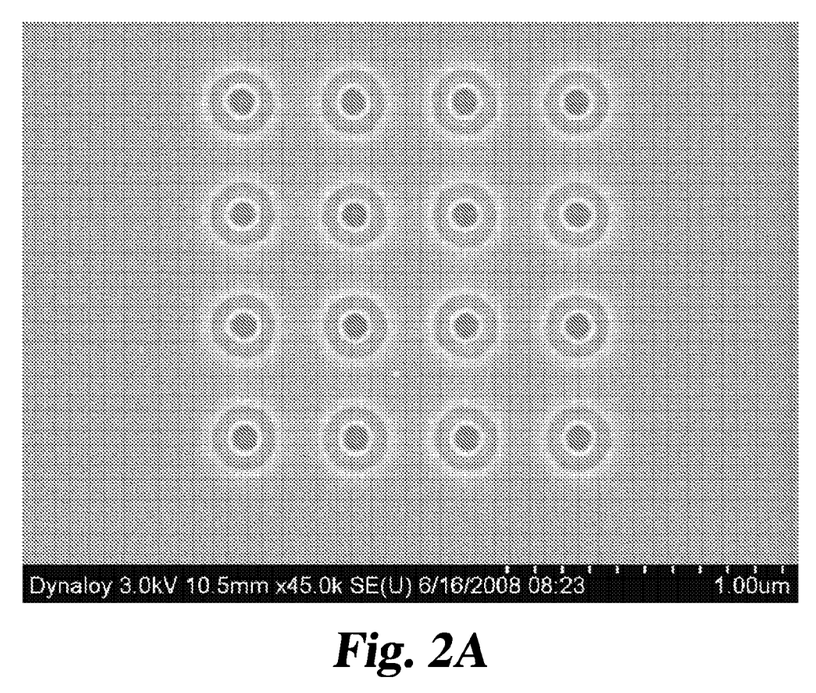
FIG. 2A provides an SEM (top view) of a via array after a successful cleaning procedure that would be considered clean (C).
Figure 2B:
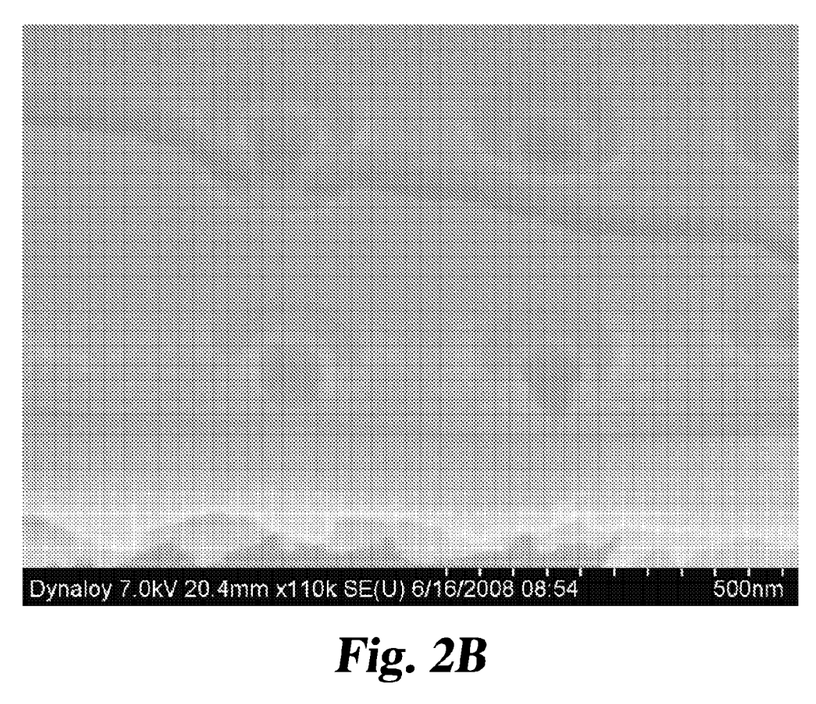
FIG. 2B provides an SEM (cross section) of a via array after a successful cleaning procedure that would be considered clean (C).
Figure 2C:
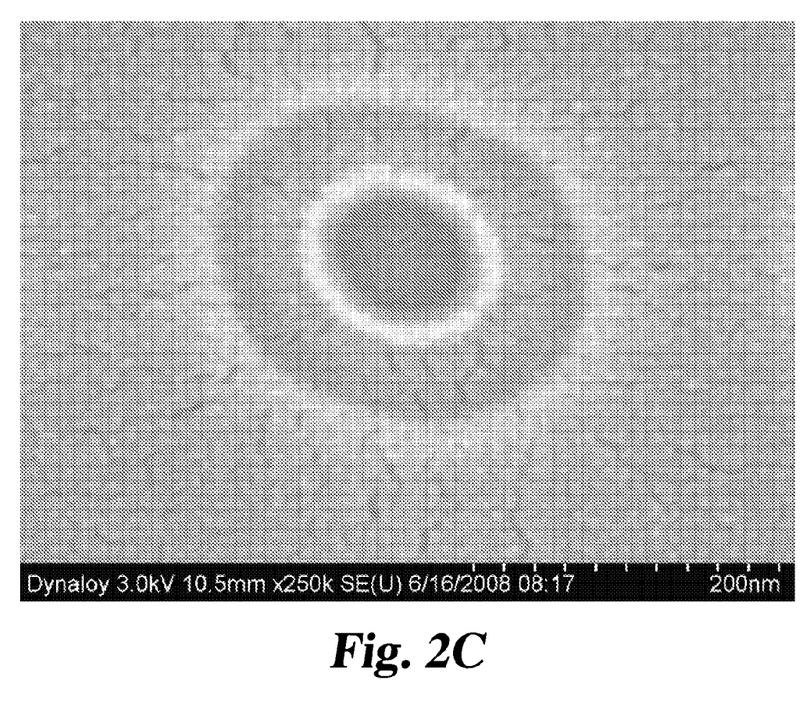
FIG. 2C provides an SEM (top view) of a single via after an successful cleaning procedure that would be considered clean (C).
Figure 3A:
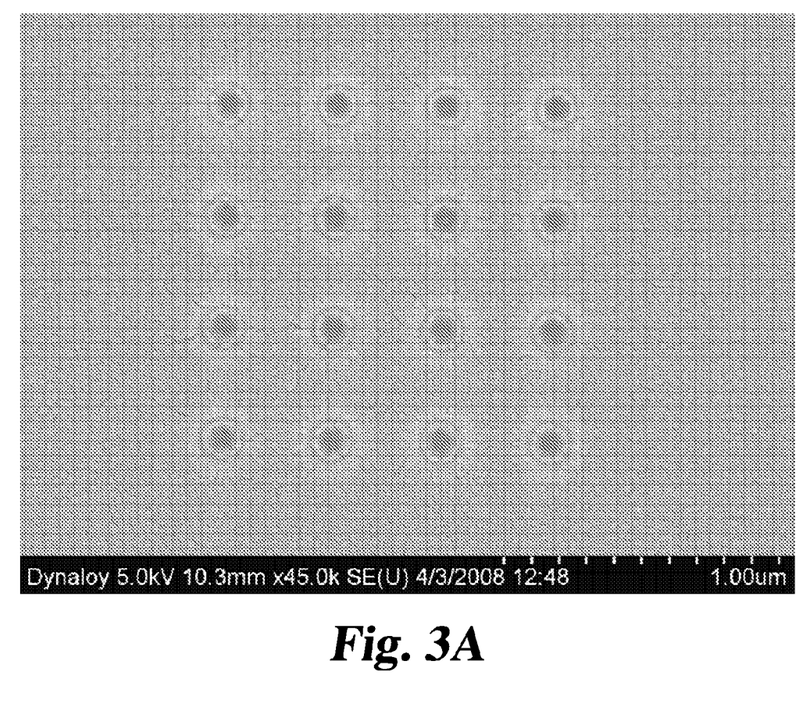
FIG. 3A provides an SEM (top view) of a via array after a successful cleaning procedure that resulted in extensive etch damage to the low k dielectric.
Figure 3B:
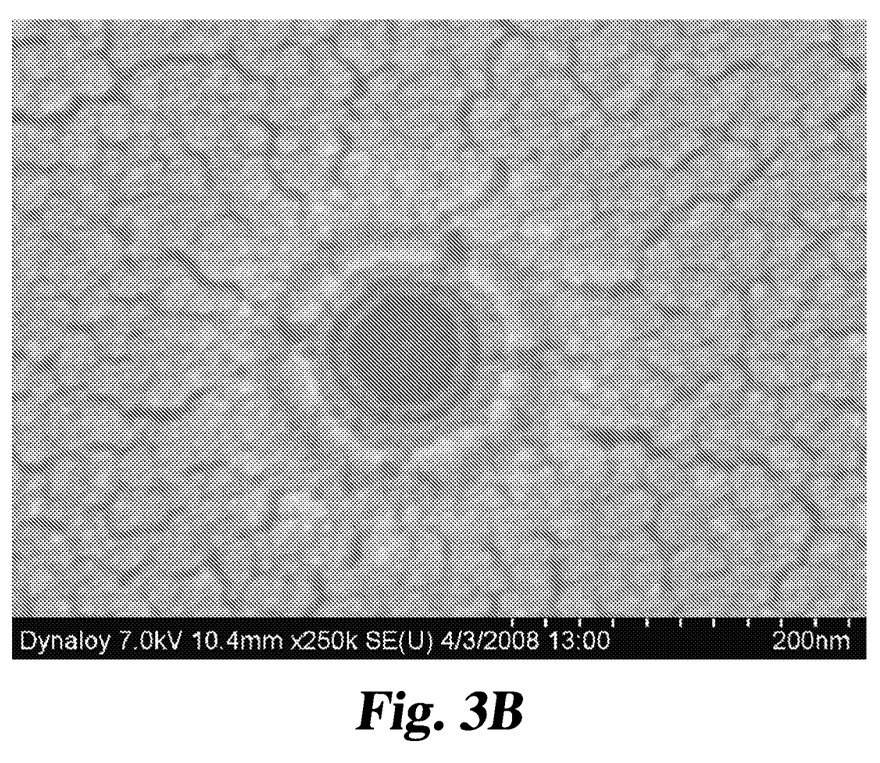
FIG. 3B provides an SEM (top view) of a via after a successful cleaning procedure that resulted in extensive etch damage to the low κ dielectric.

FIG. 1A provides an SEM (top view) of a via array illustrating a "not clean" (NC) result. FIG. 1B provides an SEM (top view) of a single via illustrating a "not clean" (NC) result. FIG. 2A provides an SEM (top view) of a via array illustrating a "clean" (C) result. FIG. 2B provides an SEM of a via array illustrating a "clean" (C) result. FIG. 2C provides an SEM (top view) of a single via illustrating a "clean" (C) result. FIG. 3A provides an SEM (top view) of a via array illustrating a wafer having extensive etching of the low-κ dielectric. FIG. 3B provides an SEM (top view) of a single via illustrating extensive etching of the low-κ dielectric.

METHODOLOGIES USED IN EXAMPLES

The components for the formulation tested in the following Examples were combined with stirring at room temperature to give 100 g of a homogeneous stripper solution. The solution was heated to 65° C. with slow agitation. Patterned test wafers with via and trench patterns formed in ultra low-κ black diamond II were obtained. The test wafers still had their photoresist stack present, and had not been cleaned or processed further after pattern transfer into the ultra low-κ black diamond II. The patterned test wafers were cleaved into ~4 cm×3 cm pieces and mounted into a small scale wafer holder.

Unless otherwise noted in a Table, each stripper solution was heated to 65° C. and a wafer piece immersed. The timer was started as soon as they were fully immersed. Immersion was maintained 1, 3, 5, or 10 minutes, after which the wafer was rinsed with isopropanol and dried. Samples were evaluated as clean (C) if substantially all materials had been removed and not clean (NC) if substantially all materials had not been removed. FIGS. 1A, 1B, 2A, 2B, 2C, 3A, and 3B illustrate what is meant by C and NC. As can be determined by the FIGS. not clean (NC) did not mean that no cleaning at all had occurred. The methods can similarly be carried out with a spray tool.

For imaging, the sample was cleaved into 2 cm×3 cm pieces and the surface was gently flushed to remove dust and particles. Samples were propped in sputter chamber at an approximately 30° angle with cleaved edge facing upward. The chamber was pumped down to 20 mTorr before Ar gas was bled in to a pressure of 50 mTorr. The power supply was turned on and adjusted to 20 mA. Samples were sputtered for 100 s [Pd target, 4" diameter, 1/8$^{th}$ inch thick from Ted Pella] to deposit approximately 0.8 nm of Pd metal on the sample surface. Scanning electron microscopy (SEM) images were obtained on either an FEI Sirion FE-SEM with 1-3 nm resolution, or a Hitachi S-4800 UHR FE-SEM with 1-1.4 nm resolution.

Example 1

Resist Removal Formulations

Test samples obtained and prepared as described above were immersed in test samples of stripper solutions for 1, 2, 3, and 4 minute intervals and evaluated for cleaning as described above. The results for several different stripper formulations are provided in Table 1 below. As shown in Table 1, the inclusion of an alkanolamine or its ether can improve cleaning performance, and the selection of the specific alkanolamine and its concentration can further impact the stripper solution's cleaning performance.

TABLE 1

| Example | Formulation | Cleaning Result (min.) at 65° C. | | | |
|---|---|---|---|---|---|
| | | 1 | 2 | 3 | 4 |
| 1-a | 87 g DMSO<br>5.5 g tetrabutylammonium hydroxide<br>4.5 g H$_2$O | NC | C | C | C |
| 1-b | 87 g DMSO<br>5.5 g tetrabutylammonium hydroxide<br>4.5 g H$_2$O<br>3 g monoethanolamine | C | C | C | C |
| 1-c | 87 g DMSO<br>5.5 g tetrabutylammonium hydroxide<br>4.5 g H$_2$O<br>3 g tertiary butylaminoethanol | NC | C | C | C |
| 1-d | 87 g DMSO<br>5.5 g tetrabutylammonium hydroxide<br>4.5 g H$_2$O<br>3 g 2-amino-2-methyl-1-propanol | NC | NC | C | C |
| 1-e | 87 g DMSO<br>5.5 g tetrabutylammonium hydroxide<br>4.5 g H$_2$O<br>3 g N,N-dimethylamino-1-propanol | NC | C | C | C |
| 1-f | 65 g DMSO<br>5.5 g tetrabutylammonium hydroxide<br>4.5 g H$_2$O<br>25 g aminoethylethanolamine | NC | NC | NC | NC |
| 1-g | 84 g DMSO<br>5.5 g tetrabutylammonium hydroxide<br>4.5 g H$_2$O<br>6 g monoethanolamine | C | C | C | C |
| 1-h | 83 g DMSO<br>3 g diethyldimethylammonium hydroxide<br>11 g H$_2$O<br>3 g monoethanolamine | C | C | C | C |
| 1-i | 81 g DMSO<br>3 g methyltriethylammonium hydroxide<br>13 g H$_2$O<br>3 g monoethanolamine | C | C | C | C |
| 1-j | 86 g DMSO<br>5.5 g tetrabutylammonium hydroxide<br>4.5 g H$_2$O<br>4 g 1-amino-2-methoxyethane | C | C | C | C |
| 1-k | 93.5 g DMSO<br>3 g tetrabutylammonium hydroxide<br>2 g H$_2$O<br>1.5 g monoethanolamine | NC | C | C | C |

TABLE 1-continued

| Example | Formulation | Cleaning Result (min.) at 65° C. | | | |
|---|---|---|---|---|---|
| | | 1 | 2 | 3 | 4 |
| 1-l | 87 g DMSO<br>4 g tetrapropylammonium hydroxide<br>6 g H$_2$O<br>3 g monoethanolamine | NC | C | C | C |

C = clean and
NC = not clean

Example 2

The Negative Effect of Tetramethylammonium Hydroxide on Cleaning

As noted in Table 2, the addition of varying amounts of tetramethylammonium hydroxide to a stripper solution interfered with the cleaning process and in some instances caused etching of the low-κ dielectric.

TABLE 2

| Example | Formulation | Cleaning Result (min.) at 65° C. | | | |
|---|---|---|---|---|---|
| | | 1 | 2 | 3 | 4 |
| 2-a | 87 g DMSO<br>5.5 g tetrabutylammonium hydroxide<br>4.5 g H$_2$O<br>3 g monoethanolamine | C | C | C | C |
| 2-b | 89 g DMSO<br>3 g tetrabutylammonium hydroxide<br>1 g tetramethylammonium hydroxide<br>4 g H$_2$O<br>3 g monoethanolamine | NC | NC | NC | NC |
| 2-c | 90 g DMSO<br>3.5 g tetrabutylammonium hydroxide<br>0.5 g tetramethylammonium hydroxide<br>3 g H$_2$O<br>3 g tertiary monoethanolamine | NC | NC | NC | NC* |
| 2-d | 87.5 g DMSO<br>5 g tetrabutylammonium hydroxide<br>0.2 g tetramethylammonium hydroxide<br>4.3 g H$_2$O<br>3 g monoethanolamine | NC | NC | NC | NC* |
| 2-e | 70 g DMSO<br>5 g tetrabutylammonium hydroxide<br>5 g H$_2$O<br>20 g monoethanolamine | NC | NC | NC | NC |

C = clean;
NC = not clean,
*= badly etched low-κ dielectric

Example 3

The Effect of Water Concentration

The data provided in Table 3 illustrates that: (a) a stripper solution with no water performed poorly, (b) the addition of some water improved the cleaning performance of the solution, and (c) the addition of too much water caused etching of the low-κ dielectric with longer contact times.

TABLE 3

| Example | Formulation | Cleaning Result (min.) at 65° C. | | | |
|---|---|---|---|---|---|
| | | 1 | 2 | 3 | 4 |
| 3-a | 42 g DMSO<br>5.5 g tetrabutylammonium hydroxide<br>49.5 g propylene glycol<br>3 g monoethanolamine | NC | NC | NC | NC |
| 3-b | 87 g DMSO<br>5.5 g tetrabutylammonium hydroxide<br>2.2 g H$_2$O<br>3 g monoethanolamine | NC | C | C | C |
| 3-c | 87 g DMSO<br>5.5 g tetrabutylammonium hydroxide<br>4.5 g H$_2$O<br>3 g monoethanolamine | C | C | C | C |
| 3-d | 87 g DMSO<br>5.5 g tetrabutylammonium hydroxide<br>7.5 g H$_2$O<br>3 g monoethanolamine | C | C* | C* | C* |

C = clean;
NC = not clean,
*= badly etched low-κ dielectric

Example 4

Temperature Effect on Cleaning

Information regarding cleaning performance as a function of temperature is provided in Table 4, below.

TABLE 4

| Example | Formulation | Cleaning Result at one minute | | | |
|---|---|---|---|---|---|
| | | 55° C. | 60° C. | 65° C. | 70° C. |
| 4 | 87 g DMSO<br>5.5 g tetrabutyl-ammonium hydroxide<br>4.5 g H$_2$O<br>3 g monoethanolamine | NC | NC | C | C |

C = clean and
NC = not clean

Example 5

A Stripper Solution Containing a Quaternary Phosphonium Hydroxide

A stripper solution containing tetrabutylphosphonium hydroxide cleaned effectively and showed little effect on the low-κ dielectric. Additionally, other quaternary phosphonium hydroxides can be utilized to optimize cleaning performance.

TABLE 5

| Example | Formulation | Cleaning Result (min.) at 65° C. | | | |
|---|---|---|---|---|---|
| | | 1 | 2 | 3 | 4 |
| 5-a | 81 g DMSO<br>7 g tetrabutylphosphonium hydroxide<br>9 g H$_2$O<br>3 g monoethanolamine | C | C | C | C |

TABLE 5-continued

| Example | Formulation | Cleaning Result (min.) at 65° C. | | | |
|---|---|---|---|---|---|
| | | 1 | 2 | 3 | 4 |
| 5-b | 81 g DMSO<br>7 g tetrabutylphosphonium hydroxide<br>9 g H$_2$O<br>3 g aminoethylethanolamine | NC | NC | C | C |
| 5-c | 80.5 g DMSO<br>7 g tetrabutylphosphonium hydroxide<br>9 g H$_2$O<br>3 g monoethanolamine<br>0.5 g glycerine | C | C | C | C |

C = clean and
NC = not clean

Example 6

A Second Polar Aprotic Solvent

As illustrated in Table 6, the stripper solutions can contain a second polar aprotic solvent and maintain desired cleaning levels.

TABLE 6

| Example | Formulation | Cleaning Result (min.) at 65° C. | | | |
|---|---|---|---|---|---|
| | | 1 | 2 | 3 | 4 |
| 2-a | 87 g DMSO<br>5.5 g tetrabutylammonium hydroxide<br>4.5 g H$_2$O<br>3 g monoethanolamine | C | C | C | C |
| 6-a | 86.5 g DMSO<br>0.5 g 1-formylpiperidine<br>5.5 g tetrabutylammonium hydroxide<br>1 g tetramethylammonium hydroxide<br>4.5 g H$_2$O<br>3 g monoethanolamine | C | C | C | C |
| 6-b | 87 g DMSO<br>5 g 1-formylpiperidine<br>5.5 g tetrabutylammonium hydroxide<br>4.5 g H$_2$O<br>3 g monoethanolamine | NC | NC | C | C |
| 6-c | 81 g DMSO<br>7 g tetrabutylphosphonium hydroxide<br>9 g H$_2$O<br>3 g monoethanolamine | C | C | C | C |
| 6-d | 80.5 g DMSO<br>0.5 g 1-formylpiperidine<br>7 g tetrabutylphosphonium hydroxide<br>9 g H$_2$O<br>3 g monoethanolamine | NC | C | C | C |
| 6-e | 81 g DMSO<br>5 g 1-formylpiperidine<br>7 g tetrabutylphosphonium hydroxide<br>9 g H$_2$O<br>3 g monoethanolamine | C | C | C | C |

C = clean and
NC = not clean

Example 7

Minimizing the Change in the Low-κ Permittivity Value(Δk) of a Substrate Blanket wafers of pristine Black Diamond II (BDII) were sectioned into about 1"×1" samples. The samples were first put into the oven at 250° C. for 30 minutes to ensure that, prior to immersion in stripper solution, they obtained the low permittivity value ($\kappa_a$) that they had at deposition. Results were recorded. The samples were then immersed in the formulation described in Example 5(c) for 60 seconds at 65° C., removed, rinsed with water and isopropyl alcohol, and dried. Permittivity measurements were made and the results recorded to provide a low permittivity value $\kappa_b$. The dried samples were then placed in an oven maintained at 250° C. for 30 minutes. Permittivity measurements were made and the results recorded ($\kappa_c$). [All permittivity values were measured on a Mercury Probe, model 802B from Materials Development Corporation, Chatsworth, Calif., www.mdc4cv.com and the results were recorded.] A typical set of values obtained from this procedure include $\kappa_a$=2.40; $\kappa_b$=2.87; and $\kappa_c$=2.49. The change in the low permittivity value (Δκ) obtained by removing volatiles is therefore 2.49−2.40 or 0.09. Had the volatiles not been removed, the change in low permittivity value (Δκ) would have been 2.87−2.40 or 0.47. Maintaining a Δκ of ≦0.1 is necessary for successful implementation in a semiconductor manufacturing process using low-κ BDII.

While applicant's invention has been described in detail above with reference to specific embodiments, it will be understood that modifications and alterations in embodiments disclosed may be made by those practiced in the art without departing from the spirit and scope of the invention. All such modifications and alterations are intended to be covered. In addition, all publications cited herein are indicative of the level of skill in the art and are hereby incorporated by reference in their entirety as if each had been individually incorporated by reference and fully set forth.

The invention claimed is:

1. A stripper solution for removing a resist from a substrate comprising a polar aprotic solvent, water, an amine, and a quaternary hydroxide, wherein the quaternary hydroxide has the formula:

wherein Z is N or P and R$^1$, R$^2$, R$^3$, and R$^4$ are alkyl groups, benzyl, aryl groups, or a combination thereof wherein the combination collectively has at least 5 carbons; and wherein water is present in an amount ranging from greater than 8 wt. % to 15 wt. % based on the weight of the solution.

2. The stripper solution of claim 1, wherein the stripper solution additionally contains glycerine and the polar aprotic solvent is selected from the group consisting of dimethyl sulfoxide and 1-formylpiperidine.

3. The stripper solution of claim 1, wherein the aprotic solvent comprises from about 40% to about 90% of the solution; the quaternary hydroxide comprises from about 2% to about 10% of the solution; and the amine comprises from about 2% to about 60% of the solution.

4. The stripper solution of claim 3, wherein the aprotic solvent is dimethyl sulfoxide.

5. The stripper solution of claim 3 wherein said amine is an alkanolamine having at least two carbon atoms, at least one amino substituent and at least one hydroxyl substituent, the amino and hydroxyl substituents attached to different carbon atoms.

6. The stripper solution of claim 3 wherein Z is P and the quaternary hydroxide is selected from the group consisting of tetrabutyl phosphonium hydroxide, tetraphenyl phosphonium hydroxide, methyl triphenyl phosphonium hydroxide, ethyl triphenyl phosphonium hydroxide, propyl triphenyl phosphonium hydroxide, butyl triphenyl phosphonium hydroxide, benzyl triphenyl phosphonium hydroxide, allyl triphenyl phosphonium hydroxide, dodecyl triphenyl phosphonium hydroxide, tetradecyl triphenyl phosphonium hydroxide, hexadecyl triphenyl phosphonium hydroxide, hexadecyl tributyl phosphonium hydroxide, carbethoxyethyl triphenyl phosphonium hydroxide, carbmethoxyethyl triphenyl phosphonium hydroxide, carbethoxymethyl triphenyl phosphonium hydroxide, and carbmethoxymethyl triphenyl phosphonium hydroxide.

7. A method for removing a resist from a substrate comprising: (a) providing a substrate having a resist thereon; (b) contacting the substrate with a stripper solution for a time sufficient to remove the resist; (c) removing the substrate from the stripping solution; and (d) rinsing the stripper solution from the substrate with a solvent, wherein the step of contacting the substrate with a stripper solution involves contacting the substrate with a stripper solution including a polar aprotic solvent, water, an amine, and a quaternary hydroxide having the formula:

where Z is N or P and $R^1$, $R^2$, $R^3$, and $R^4$ are alkyl groups, benzyl, aryl groups, or a combination thereof wherein the combination collectively has at least 5 carbons; and wherein water is present in an amount ranging from greater than 8 wt. % to 15 wt. % based on the weight of the solution.

8. The method of claim 7, wherein contacting the substrate with a stripper solution includes contacting the substrate with a stripper solution including a polar aprotic solvent comprising from about 40% to about 90% of the solution; water comprising from about 10% to about 15% of the solution; the quaternary hydroxide comprising from about 2% to about 10% of the solution; and the amine comprising from about 2% to about 60% of the solution.

9. The method of claim 7, wherein contacting the substrate with a stripper solution includes contacting the substrate with a stripper solution, wherein the polar aprotic solvent is dimethyl sulfoxide.

10. The method of claim 9, wherein contacting the substrate with a stripper solution includes contacting the substrate with a stripper solution, wherein the polar aprotic solvent further comprises 1-formylpiperidine.

11. The method of claim 7, wherein contacting the substrate with a stripper solution includes contacting the substrate with a stripper solution including an amine which comprises an alkanolamine having at least two carbon atoms, at least one amino substituent and at least one hydroxyl substituent, the amino and hydroxyl substituents attached to different carbon atoms.

12. The method of claim 11, wherein contacting the substrate with a stripper solution includes contacting the substrate with a stripper solution having quaternary hydroxide selected from the group consisting of tetrabutyl phosphonium hydroxide, tetraphenyl phosphonium hydroxide, methyl triphenyl phosphonium hydroxide, ethyl triphenyl phosphonium hydroxide, propyl triphenyl phosphonium hydroxide, butyl triphenyl phosphonium hydroxide, benzyl triphenyl phosphonium hydroxide, allyl triphenyl phosphonium hydroxide, dodecyl triphenyl phosphonium hydroxide, tetradecyl triphenyl phosphonium hydroxide, hexadecyl triphenyl phosphonium hydroxide, hexadecyl tributyl phosphonium hydroxide, carbethoxyethyl triphenyl phosphonium hydroxide, carbmethoxyethyl triphenyl phosphonium hydroxide, carbethoxymethyl triphenyl phosphonium hydroxide, and carbmethoxymethyl triphenyl phosphonium hydroxide.

13. The method of claim 7, wherein contacting the substrate with a stripper solution includes immersing the substrate in the stripping solution with agitation at a temperature of at least about 40° C.

14. The method of claim 7, wherein contacting the substrate with a stripper solution includes spraying the stripper solution onto the substrate, wherein the stripper solution is at a temperature of at least about 40° C.

15. The method of claim 7, wherein providing a substrate having a resist thereon, involves providing a substrate having a resist which is a bilayer resist having two polymer layers.

16. The method of claim 7, wherein providing a substrate having a resist thereon, involves providing a substrate having a resist which is a bilayer resist having one inorganic layer and one polymer layer.

17. The method of claim 7, further comprising the step of removing adsorbed volatiles from the substrate to obtain a processed substrate, wherein providing a substrate includes providing a substrate having a low-κ permittivity value identified as $\kappa_a$ and obtaining a processed substrate includes obtaining a processed substrate having a low-κ permittivity value identified as $\kappa_c$, wherein, Δκ is defined as the difference between $\kappa_c$ and $\kappa_a$, and wherein $\Delta\kappa \leq 0.1$.

18. An electronic device prepared according to the method comprising: (a) providing a substrate having a resist thereon; (b) contacting the substrate with a stripper solution for a time sufficient to remove a desired amount of resist; (c) removing the substrate from the stripping solution; and (d) rinsing the stripper solution from the substrate with a solvent, wherein contacting the substrate with a stripper solution involves contacting the substrate with a stripper solution including a polar aprotic solvent, water, an amine, and a quaternary hydroxide having the formula:

where Z is N or P and $R^1$, $R^2$, $R^3$, and $R^4$ are alkyl groups, benzyl, aryl groups, or a combination thereof wherein the combination collectively has at least 5 carbons; and wherein water is present in an amount ranging from greater than 8 wt. % to 15 wt. % based on the weight of the solution.

19. A method for preparing a BEOL stripper solution comprising the acts of: (a) providing a container; (b) providing components of the stripper solution formulation; and (c) adding said components of said stripper solution to said container to provide contents, wherein said providing components involves providing a polar aprotic organic solvent, water, an amine, and a quaternary hydroxide, the quaternary hydroxide having the formula:

where Z is N or P and $R^1$, $R^2$, $R^3$, and $R^4$ are alkyl groups, benzyl, aryl groups, or a combination thereof wherein the combination collectively has at least 5 carbons; and wherein water is present in an amount ranging from greater than 8 wt. % to 15 wt. % based on the weight of the solution.

* * * * *